United States Patent
Cao et al.

(10) Patent No.: US 10,319,847 B2
(45) Date of Patent: Jun. 11, 2019

(54) SEMICONDUCTOR DEVICE WITH A STEEP SUB-THRESHOLD SLOPE

(71) Applicant: INTERNATIONAL BUSINESS MACHINES CORPORATION, Armonk, NY (US)

(72) Inventors: Qing Cao, Yorktown Heights, NY (US); Ning Li, White Plains, NY (US)

(73) Assignee: International Business Machines Corporation, Armonk, NY (US)

(*) Notice: Subject to any disclaimer, the term of this patent is extended or adjusted under 35 U.S.C. 154(b) by 14 days.

(21) Appl. No.: 15/222,324

(22) Filed: Jul. 28, 2016

(65) Prior Publication Data

US 2018/0033864 A1 Feb. 1, 2018

(51) Int. Cl.
| H01L 27/20 | (2006.01) |
| H01L 29/10 | (2006.01) |
| H01L 29/16 | (2006.01) |
| H01L 29/78 | (2006.01) |
| H01L 29/66 | (2006.01) |
| H01L 41/18 | (2006.01) |
| H01L 29/735 | (2006.01) |

(52) U.S. Cl.
CPC ............ *H01L 29/78* (2013.01); *H01L 27/20* (2013.01); *H01L 29/1008* (2013.01); *H01L 29/1606* (2013.01); *H01L 29/66568* (2013.01); *H01L 29/66977* (2013.01); *H01L 29/735* (2013.01); *H01L 41/18* (2013.01)

(58) Field of Classification Search
CPC .............. H01L 29/513; H01L 29/4983; H01L 29/66568; H01L 29/78
See application file for complete search history.

(56) References Cited

U.S. PATENT DOCUMENTS

| 2014/0158989 | A1* | 6/2014 | Byun | H01L 29/452 257/29 |
| 2014/0353754 | A1* | 12/2014 | Farmer | H01L 29/778 257/347 |
| 2016/0020280 | A1* | 1/2016 | Heo | H01L 33/26 257/27 |
| 2016/0204204 | A1* | 7/2016 | Franklin | H01L 29/778 257/29 |

* cited by examiner

*Primary Examiner* — William F Kraig
*Assistant Examiner* — Vicki B. Booker
(74) *Attorney, Agent, or Firm* — Tutunjian & Bitetto, P.C.; Erik Johnson

(57) ABSTRACT

A method is presented for forming a semiconductor device. The method may include forming a source contact on the semiconductor substrate, forming a drain contact on the semiconductor substrate, and forming a gate structure on the semiconductor substrate between the source and drain contacts, the gate structure including a piezoelectric material having at least one graphene layer.

16 Claims, 6 Drawing Sheets

SEMICONDUCTOR DEVICE WITH A STEEP SUB-THRESHOLD SLOPE

BACKGROUND

Technical Field

The present invention relates generally to semiconductor devices, and more specifically, to semiconductor devices exhibiting steep sub-threshold slopes.

Description of the Related Art

One of the main barriers to achieving lower energy CMOS (complementary metal oxide semiconductor) logic is the difficulty in lowering the supply voltage. The supply voltage is constrained by the sub-threshold swing, which is limited by Fermi-Dirac statistics to 60 mV/decade at room temperature. In particular, it is known that with a conventional FET (field effect transistor), a change in the channel potential of at least 60 mV at 300 K is needed to cause a change in the current by a factor of 10. This minimum sub-threshold slope results in a fundamentally lower limit on the operating voltage for conventional FET semiconductor switches. With ever decreasing device dimensions, forming the individual components and electrical contacts become more difficult.

SUMMARY

In accordance with an embodiment of the present principles, a method is provided for forming a semiconductor device. The method includes the steps of forming a source contact on the semiconductor substrate and forming a drain contact on the semiconductor substrate. The method further includes the step of forming a gate structure on the semiconductor substrate between the source and drain contacts, the gate structure including a piezoelectric material having at least one graphene layer.

In accordance with another embodiment of the present principles, a semiconductor device is provided. The device includes a semiconductor substrate, a source contact formed on the semiconductor substrate, and a drain contact formed on the semiconductor substrate. The device further includes a gate structure formed on the semiconductor substrate between the source and drain contacts, the gate structure including a piezoelectric material having at least one graphene layer.

In accordance with another embodiment of the present principles, a semiconductor device is provided. The device includes a semiconductor substrate having a source contact, a drain contact, and a gate structure formed thereon, wherein the gate structure includes a piezoelectric material having at least one graphene layer extending into the source contact.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be disclosed within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

Throughout the drawings, same or similar reference numerals represent the same or similar elements.

DETAILED DESCRIPTION

Figure 1:
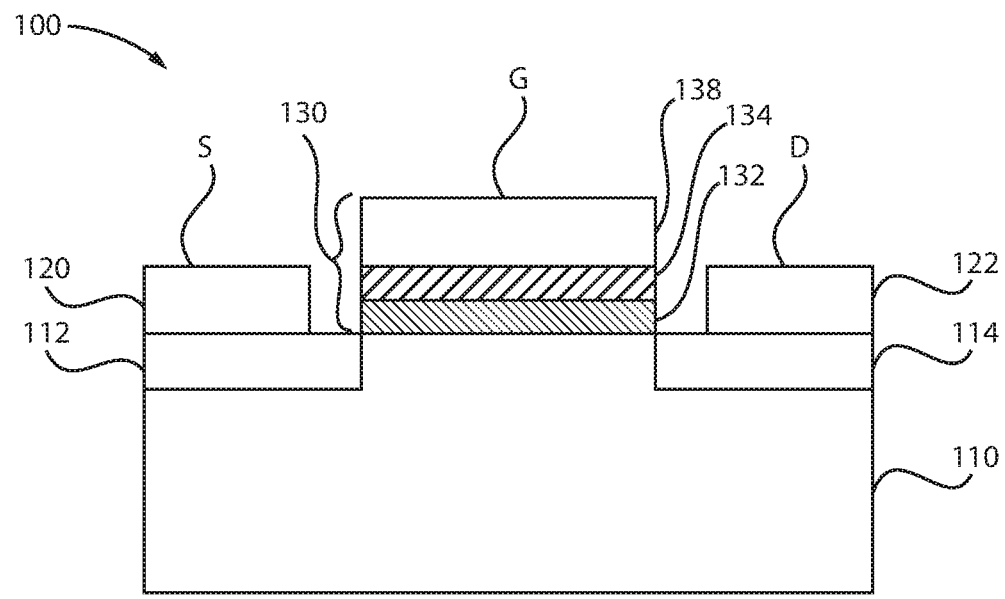
FIG. 1 is a cross-sectional view of a semiconductor device having a graphene layer, in accordance with an embodiment of the present principles.

Principles and embodiments of the present disclosure relate generally to the formation of a semiconductor device. The formation includes forming a semiconductor substrate, forming a source contact on the semiconductor substrate, forming a drain contact on the semiconductor substrate, and forming a gate structure on the semiconductor substrate between the source and drain contacts, the gate structure including a piezoelectric material having at least one graphene layer.

Principles and embodiments of the present disclosure relate generally to a semiconductor device structure. The semiconductor device structure includes a semiconductor substrate, a source contact formed on the semiconductor substrate, a drain contact formed on the semiconductor substrate, and a gate structure formed on the semiconductor substrate between the source and drain contacts, the gate structure including a piezoelectric material having at least one graphene layer.

In one or more embodiments, the graphene layer is a monolayer of conjugated $sp^2$ bonded carbon atoms tightly packed into a two-dimensional (2D) hexagonal lattice. One of the primary advantages of graphene is that it has extremely high intrinsic carrier (electron and hole) mobility, and, thus, has extremely high electric conductivity. Graphene has the potential to have the highest conductivity and lowest resistivity of any material, with a conductivity even higher than that of silver. The high electrical conductivity of graphene allows the use of an extremely thin graphene material base layer, even one comprising only a single graphene sheet and having a thickness of approximately 0.28-0.30 nm for a single sheet of graphene.

In one or more embodiments, use of such a thin graphene base layer reduces the transit time of electrons through the base layer and also reduces the energy loss of hot electrons in transiting the thin graphene base material. In addition, the high velocity of electrons in the graphene material may lower the base transit time. Thus, the semiconductor device with a graphene material base layer may have high fT and high fmax.

In one or more embodiments, the graphene material layer may be either an N-type graphene material or a P-type graphene material or a combination of N-type and P-type graphene material.

In one or more embodiments, the use of graphene within the base layer of the transistor may enable a thin base layer that allows short transit time for electrons through the graphene material layer. The use of graphene within the base layer also allows for a base layer with a low resistance that increases the maximum frequency of oscillation of a transistor. The use of graphene within the base layer of a transistor may further allow for the use of high performance wide bandgap materials, such as AlGaN, GaN, InAlN, and SiC for the collector of the transistors. Wide bandgap materials, such as AlGaN, GaN, InAlN and SiC have a high Johnson figure of merit, and, thus, the graphene base transistor may allow for high power, high frequency operation. The wide bandgap nature of, for example, AlGaN, GaN, InAlN and GaN, allows for high temperature operation of the graphene base transistor. In addition, the enhanced lateral thermal conductivity of graphene may spread the thermal load to a larger area, and, thus, reduce the thermal resistance. Finally, the use of graphene within the base layer may also lower the transistor turn-on voltage, thereby reducing power dissipation within the semiconductor device.

While a single layer graphene material has a zero voltage bandgap, a bi-layer graphene material layer consisting of two sheets of graphene may have a bandgap of approximately 250 millielectron volts. A single layer graphene sheet may also have a bandgap by forming the graphene sheet into nanoribbons, patterned hydrogen absorption, or an antidot design. The signal layer graphene sheet may also have a bandgap by doping with appropriate atoms.

In one or more embodiments, the graphene material layer may comprise one or more graphene sheets, one or more graphene oxide sheets, one or more fluorographene sheets, one or more functionalized graphene sheets, or combinations thereof. Another embodiment of a graphene material layer is a material that has a graphene oxide sheet or a fluorographene sheet on the first surface of the graphene material layer, a graphene sheet on a second surface of the graphene material layer, and one or more graphene sheets intermediate between a graphene oxide sheet or a fluorographene sheet on the first surface and the graphene sheet on the second surface.

Other embodiments for the graphene material layer may have other arrangements for the stacking of graphene sheets, graphene oxide sheets, fluorographene sheets, or the functionalized graphene sheets. Each sheet of the graphene material layer may be selected for N-type or P-type doping characteristics, carrier density characteristics, zero-bandgap or non-zero bandgap characteristics, and mobility characteristics. The graphene material layer may have intercalated atoms or molecules between the graphene sheets such as intercalated hydrogen, intercalated oxygen, intercalated gold, intercalated boron, intercalated bromine, intercalated nitrogen, or other atoms or molecules. The intercalated atoms or molecules may change the doping characteristics and bandgap of each of the graphene sheets and may induce a non-zero bandgap in the graphene sheets.

In one or more embodiments, the graphene material layer may be formed on the surface of the substrate by epitaxial growth of a graphene material layer on the substrate (such as a SiC substrate, catalytic or transition metal film on a substrate, or catalytic or transition metal foil substrate), by growth of a graphene material layer on a second substrate and then transfer and bonding of the graphene material layer to the substrate, by deposition of a graphene material layer, or by growth of a graphene material layer at the interface between a metal layer and a substrate surface. The graphene material layer may have small bandgap (in the case of bi-layer graphene or doped graphene) or no bandgap (in the case of single-layer graphene).

In one or more embodiments, during an epitaxial growth process, atoms are typically deposited on a substrate and the atoms diffuse along the surface of the substrate until they reach a nucleation site and bond at the nucleation site. Because graphene is primarily sp2 bonded with few unbonded bonds, the deposited semiconductor material film atoms readily diffuse on the graphene sheet surface to a nucleation site. One advantage that the high diffusivity of atoms on the graphene surface has is the ability to diffuse a large distance on the graphene surface without bonding to a nucleation site, which results in large grain size in the case of polycrystalline or highly oriented semiconductor material films. The large grain size typically has higher minority carrier lifetime and higher luminescence efficiency within the large grain size material than for the small grain size material. The large grain size helps improve the photovoltaic cell efficiency of materials, such as CdTe, CdS, ZnTe, copper indium gallium selenide, copper zinc tin sulfide, copper zinc tin selenide.

The high resistance to atom diffusing through the graphene sheet from the substrate into the semiconductor material layer, also allows for a higher anneal temperature without the substrate atoms diffusing into the photovoltaic material or light emitting material. The higher anneal temperature enables larger grain size and improved photovoltaic and light emitting materials. A capping layer, such as PECVD silicon nitride, may be deposited on the surface of the semiconductor material layer during the anneal process to prevent the surface of the semiconductor material layer from decomposing during the high temperature anneal.

The primary approaches for forming a graphene material layer on a substrate (or on a substrate translation layer on a substrate) are by: 1) epitaxial growth on a substrate, 2) by CVD growth on a metal film on a substrate or by growth on a metal foil substrate, 3) by growth of a graphene material layer on a second substrate and then transfer and bonding of the graphene material layer to the substrate, 4) by deposition on a substrate by microwave plasma enhanced CVD, and 5) by growth of graphene at the interface between a metal and a substrate.

In some embodiments, the preferred number of graphene sheets in the graphene material film is one graphene sheet. The graphene material layer may have special mobility, bandgap, and light absorption properties for the case of one graphene sheet. The graphene material layer with one graphene sheet typically has zero bandgap, has the highest mobility, and may have special spin transport properties. For the case of a graphene material layer with one graphene sheet, it may be desirable to minimize the number of sp3 carbon bonds that are created in forming the nucleation sites for growth of the semiconductor material layer.

The graphene material layer may contain graphene sheets that are N-type or contain graphene sheets that are P-type or contain both N-type and P-type graphene sheets. The graphene material layer may have an overall P-type or N-type characteristic depending on the mobility, carrier density, and number of P-type or N-type graphene sheets within the graphene material layer. The graphene material layer may have selected free carrier concentration and impurity doping to generate the selected free carrier concentration. There are multiple growth techniques of forming P-type graphene material layers. Graphene sheets that are grown on the carbon face of SiC are often P-type. Graphene sheets intercalatated with gold are P-type. Graphene sheet grown by CVD on a copper film are typically P-type. Graphene sheets grown on the carbon face of SiC are often P-type. Graphene grown on the silicon face of SiC are often N-type. N-type graphene may be formed by annealing in ammonia ambient or in nitrogen ambient.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

A "gate structure" means a structure used to control output current (i.e., flow of carriers in the channel) of a semiconducting device through electrical or magnetic fields.

As used herein, the term "drain" means a doped region in semiconductor device located at the end of the channel, in which carriers are flowing out of the transistor through the drain.

As used herein, the term "source" is a doped region in the semiconductor device, in which majority carriers are flowing into the channel.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure may be present between the first element and the second element.

It is to be understood that the present invention will be described in terms of a given illustrative architecture; however, other architectures, structures, substrate materials and process features and steps/blocks may be varied within the scope of the present invention. It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional side view of a semiconductor device is presented, in accordance with an embodiment of the present principles.

The semiconductor device 100 includes a substrate 110, a source contact 120, a drain contact 122, and a gate structure 130. The substrate 110 includes a first doped region 112 below the source contact 120 and a second doped region 114 below the drain contact 122. The substrate 110 may be formed of silicon (Si), or other known semiconductor materials. The substrate 110 may have a SOI (silicon on insulator) type structure, or other known structures. In one or more embodiments, the substrate 110 may be a single crystal semiconductor. The substrate may be essentially (i.e., except for contaminants) a single element (e.g., silicon), primarily (i.e., with doping) of a single element, for example, silicon (Si).

The substrate 110 may be a commercially available semiconductor substrate having a diameter from 150 mm to 300 mm, and preferably from 200 mm to 300 mm, and having a thickness from 500 micron to 1.0 mm. In one embodiment, the substrate 110 is a single crystalline silicon-containing-semiconductor substrate, i.e., a single crystalline substrate containing silicon or a silicon alloy. The single crystalline silicon-containing semiconductor substrate may include a single crystalline silicon material, a single crystalline silicon-germanium alloy material, a single crystalline silicon-carbon alloy material, or a single crystalline silicon-germanium-carbon alloy material. If the substrate 110 is a single crystalline silicon-containing-semiconductor substrate, the substrate 110 may have any arbitrary crystallographic orientation. The substrate 110 may be a bulk substrate, a semiconductor-on-insulator (SOI) substrate including a top semiconductor layer having a single crystalline silicon-containing semiconductor material, or a hybrid substrate having a bulk portion and an SOI portion.

The substrate 110 of the semiconductor material may include any of a single-crystal material, a highly ordered material, a polycrystalline material, a non-single crystalline material, a ceramic material, a glass material, an amorphous material, a metal material, a metal foil material, a metal layer on a material, a polymer material, a flexible polymer material, an organic semiconductor, polymer semiconductor, crystalline material, a liquid crystalline polymer material, a quasi-crystalline polymer material, a composite material, a layered composite material, or combinations thereof. The substrate 110 may comprise one or more material layers and in particular, one or more semiconductor material layers. The substrate 110 may be conductive, semiconductor, semi-metal, semi-insulating, or insulating. The substrate 110 may be selected to have optimized bandgap energy and selected breakdown critical electric field. The substrate 110 may be selected to produce a preferred conduction band potential barrier or valance band potential barrier for the graphene material layer/substrate heterojunction. The substrate 110 may be selected for mechanical strength. The substrate 110 may be flexible. The substrate 110 may be selected to have a thermal coefficient of expansion that closely matches the thermal expansion coefficient of the semiconductor material layer. The substrate 110 may be selected to be compatible with the deposition temperature for the semiconductor material film. The substrate 110 may be selected to have high thermal conductivity to enable an electronic device with high power capability. The substrate 110 may be selected to be optically transparent to backside illumination with detector devices or photovoltaic device on the front side or optically transparent for light emitting devices that emit light through the substrate 110.

The substrate 110 may be selected for the property that the graphene material layer 134 may be directly grown on the substrate 110. For example, the graphene material layer 134 may be formed on the surface of a SiC substrate by epitaxial growth that involves the desorption of silicon atoms from the surface at temperatures in the range of 1000 C to 2000 C. In addition, graphene material layers 134 may be grown on a metal layer on a material (such as glass, quartz, sapphire, or other substrate materials) or on a metal foil material by exposing the surface of the metal material to a carbon containing molecules, such as methane and heating with a selected procedure to form graphene on the surface of the metal layer or metal foil material. For example, graphene material layer consisting of one or more graphene sheets may be formed on the surface of copper, nickel, nickel with gold catalyst, iron, iridium (and other metals) surfaces by chemical vapor deposition (CVD) growth using ambient containing methane and other carbon containing molecules. Amorphous carbon layer and polymer layers that may be converted to carbon material may also be deposited on the surface of the metal layer or the metal foil and an annealing procedure performed to form graphene material layer 134 on the surface of the metal layer or metal foil material.

The substrate 110 may be fabricated from a semiconductor, a semimetal, a metal or one or more graphene sheets 134. In addition, the substrate 110 may consist of a single N-type material layer formed on a silicon, germanium, InP, GaAs, InAs, InGaAs, GaSb, SiC, GaN, ZnO, AlN, diamond, polycrystalline diamond, Chemical Vapor Deposited Diamond, composite of polycrystalline diamond and CVD diamond, low surface roughness polycrystalline diamond, or other diamond substrate material, boron nitride, metal film on a substrate, or metal foil substrate using homoepitaxial growth, heterojunction epitaxial growth, psuedomorphic growth, methomorphic growth, graded epitaxial growth, direct wafer bonding, or transferred substrate approaches or may further include an N− type material layer formed on the N+ type substrate material layer or substrate with or without a substrate transition layer disposed within substrate at the substrate interface with the graphene material layer 134.

The gate structure 130 includes a gate dielectric layer 132, a graphene material layer or graphene layer 134, and a gate contact 138. The gate dielectric layer 132 may be formed of a thin insulator layer of silicon dioxide ($SiO_2$) or other suitable gate dielectric or insulating materials.

The graphene material layer 134 typically consists of grains with dimensions that may range from nanoscale to multiple micron dimensions. The graphene material layer 134 may consist of nanographene size dimensions. The graphene material layer 134 may also consist of one or more overlapping sheets, as discussed below with reference to FIGS. 3 and 4.

In one or more embodiments, the graphene material layer 134 may comprise one or more sheets of graphene that have N-type conduction properties (having predominantly electron conduction), one or more sheets that have P-type conduction properties (having predominantly hole conduction), or, in some embodiments, may comprise a layered structure having one or more sheets with N-type conduction properties and one or more sheets with P-type conduction properties, interlayered with one or more undoped sheets of graphene. In some cases, one or more of the top and the bottom graphene layers may be doped in a different way than the remaining graphene layers in the graphene material layer 134. The first surface of the graphene material layer 134 may be modified to optimize the density and characteristics of nucleation sites for the growth of a semiconductor material layer (or for growth of the optional graphene translation material) on the surface of the graphene material layer 134.

In one or more embodiments, the use of graphene for the graphene material layer 134 also allows for a graphene material layer 134 with a low sheet resistance that increases the maximum frequency of operation. One key parameter for semiconductor structures is the graphene material layer sheet resistance. A low graphene material layer sheet resistance may enable light-emitting devices and lasers with low forward voltage. A low graphene material layer sheet resistance helps achieve an electronic device with high maximum frequency of operation. The graphene material layer 134 is thin, which then allows a short transit time for electrons traveling perpendicular through the graphene material layer 134.

Another key feature is that the graphene sheets 134 are highly resistant to atoms diffusing vertically (perpendicular to the graphene sheet) through the graphene sheet 134. Thus, impurities that are in the substrate material (such as impurities in a metal foil) do not diffuse through the graphene sheet into a semiconductor material film (such as CdTe or GaN) that is grown on the graphene material layer 134 on a metal foil. The impurities may degrade the minority carrier lifetime in photovoltaic devices or the luminescence in light emitting devices.

In one or more embodiments, the graphene material layer 134 typically consists of grains with dimensions that may range from nanoscale to multiple micron dimensions. The graphene material layer 134 may consist of nanographene with nanoscale size dimensions. An approach to increase the density of nucleation sites for the growth of a semiconductor material layer includes forming or growing graphene with a high density of defects with the defects acting as nucleation site for the growth of the semiconductor material film (or graphene interface transition layer). Graphene that has small grain size has sites for nucleation of graphene semiconductor material at the graphene material layer grain boundaries, and, thus, may have a high density of nucleation sites. In addition, graphene material layers 134 may be grown to have nano-grains that provide a high density of nucleation site for the growth of graphene material layer. For many device applications of semiconductor material on graphene, the key material property for the graphene material layer 134 is that the graphene material layer has low sheet resistance. The graphene material layer sheet resistance is degraded by the presence of grain boundaries, however, because the conductivity of the graphene material layer 134 is so high, even graphene material with grain boundaries has low sheet resistance.

In addition, it is necessary that the electrons are able to transport across the interface between the graphene material layer 134 and the substrate 110. It is thus generally desirable that if insulating material such as a native oxide or deposited insulator or grown insulator exists on the surface of the substrate 110, the insulating material should be sufficiently thin that electrons may transit from the graphene material layer 134 into the substrate 110 (transit by tunneling) with only small perturbation to the electron transit across the interface.

In FIG. 1, a length of the graphene material 134 is approximately equal to a length of the gate dielectric layer 132 and a length of the gate contact 138. A height of the graphene material 134 may be approximately equal to a height of the gate dielectric layer 132. Of course, one skilled in the art may contemplate the height of the graphene material 134 to be different than the height of the gate dielectric layer 132.

In one exemplary embodiment, by making the graphene material layer 134 thin enough, the mechanics of the graphene layer 134 are such that the gate contact 138 modulates the work function of the graphene layer 134 in such a way that the threshold voltage of the semiconductor device 100 varies from the positive to negative regime, to thereby achieve a steep sub-threshold slope of about 60 mV/decade or less, and allow operation at low voltage.

Figure 2:
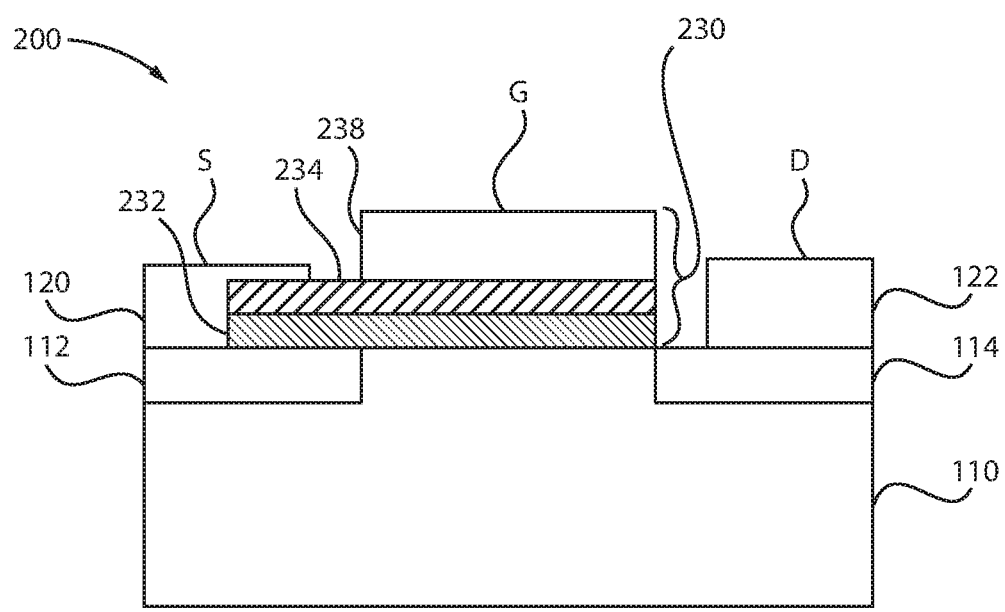
FIG. 2 is a cross-sectional view of a semiconductor device having a graphene layer extending into a source contact, in accordance with an embodiment of the present principles.

FIG. 2 is a cross-sectional view of a semiconductor device having a graphene layer extending into a source contact, in accordance with an embodiment of the present principles.

The gate structure 230 of the semiconductor device 200 includes a gate dielectric layer 232, a graphene material layer or graphene layer 234, and a gate contact 238. The gate dielectric layer 232 may be formed of a thin insulator layer of silicon dioxide ($SiO_2$) or other suitable gate dielectric or insulating materials.

In contrast to FIG. 1, the gate dielectric layer 232 and the graphene layer 234 extend beyond the gate contact 238 and into the source contact 120. In one example embodiment, the gate dielectric layer 232 and the graphene layer 234 may extend to a midpoint of the source contact 120. In another example embodiment, the gate dielectric layer 232 and the graphene layer 234 may extend to over 50% of the surface area or length of the source contact 120. One skilled in the art may contemplate extending the gate dielectric layer 232 and the graphene layer 234 anywhere between 5% and 95% of a length of the source contact 120.

Additionally, the gate dielectric layer 232 and the graphene layer 234 may have an approximately equal length and an approximately equal height. Therefore, the gate dielectric layer 232 and the graphene layer 234 may extend to a same point of the source contact 120. However, it is contemplated that the gate dielectric layer 232 may extend beyond the graphene layer 234, and vice versa. Additionally, the height of the graphene layer 234 may be less than the height of the source contact 120. In one embodiment, the height of the graphene layer 234 is less than half the height of the source contact 120.

Figure 3:
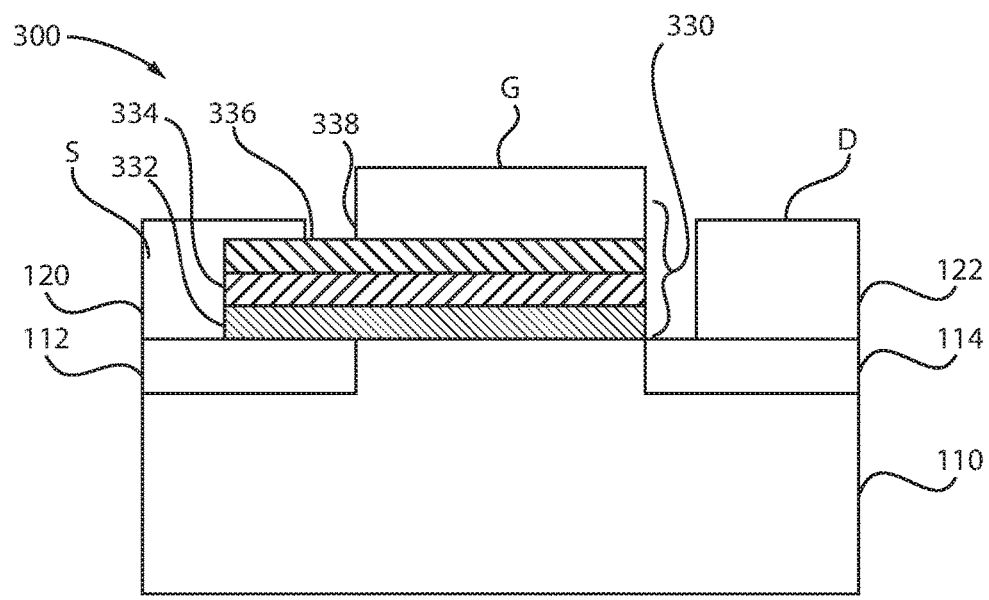
FIG. 3 is a cross-sectional view of a semiconductor device having two graphene layers, in accordance with an embodiment of the present principles.

FIG. 3 is a cross-sectional view of a semiconductor device having two graphene layers, in accordance with an embodiment of the present principles.

The gate structure 330 of the semiconductor device 300 includes a gate dielectric layer 332, a first graphene material layer or graphene layer 334, a second graphene material layer or graphene layer 336, and a gate contact 338. The gate dielectric layer 332 may be formed of a thin insulator layer of silicon dioxide ($SiO_2$) or other suitable gate dielectric or insulating materials.

In contrast to FIG. 2, the gate contact 338 includes two overlapping graphene layers 334, 336. The dielectric layer 332, the first graphene layer 334, and the second graphene layer 336 extend beyond the gate contact 338 and into the source contact 120. In one example embodiment, the gate dielectric layer 332, the first the graphene layer 334, and the second graphene layer 336 may extend to a midpoint of the source contact 120. In another example embodiment, the gate dielectric layer 332, the first graphene layer 334, and the second graphene layer 336 may extend to over 50% of the surface area or length of the source contact 120. One skilled in the art may contemplate extending the gate dielectric layer 332, the first graphene layer 334, and the second graphene layer 336 anywhere between 5% and 95% of a length of the source contact 120.

Additionally, the first and second graphene layers 334, 336 may have an approximately equal length and an approximately equal height. Therefore, the first and second graphene layers 334, 336 may extend to a same point of the source contact 120. However, it is contemplated that one graphene layer may extend beyond the other graphene layer, as well as beyond the gate dielectric layer 332, as discussed below with reference to FIG. 4.

Figure 4:
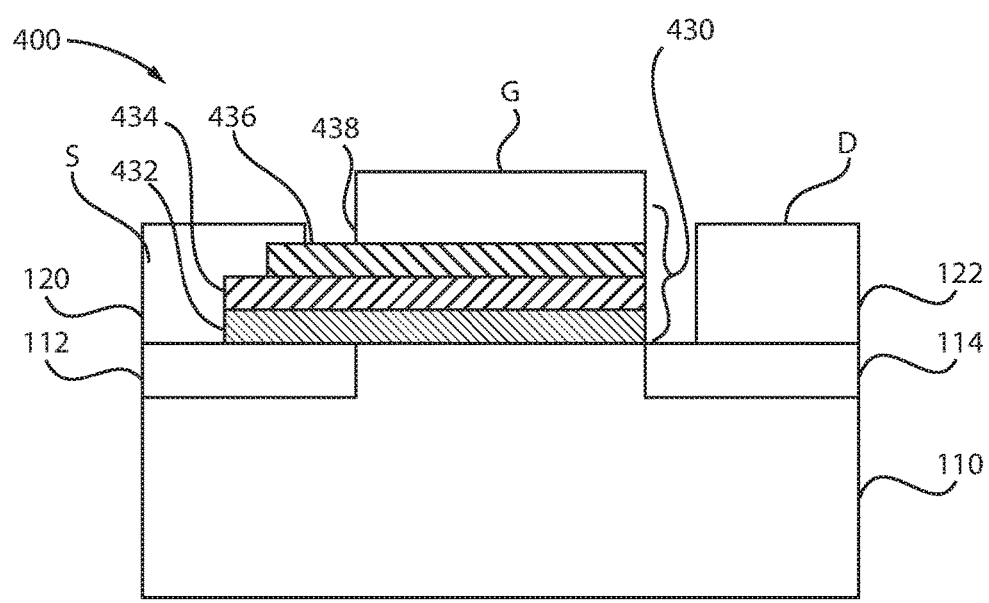
FIG. 4 is a cross-sectional view of a semiconductor device having two graphene layers of different dimensions, in accordance with an embodiment of the present principles.

FIG. 4 is a cross-sectional view of a semiconductor device having two graphene layers of different dimensions, in accordance with an embodiment of the present principles.

The gate structure 430 of the semiconductor device 400 includes a gate dielectric layer 432, a first graphene material layer or graphene layer 434, a second graphene material layer or graphene layer 436 and a gate contact 438. The gate dielectric layer 432 may be formed of a thin insulator layer of silicon dioxide ($SiO_2$) or other suitable gate dielectric or insulating materials.

In contrast to FIG. 3, the gate contact 438 includes two overlapping graphene layers 434, 436 that are of different lengths. The dielectric layer 432, the first graphene layer 434, and the second graphene layer 436 extend beyond the gate contact 438 and into the source contact 120. In one example embodiment, the gate dielectric layer 432 and the first graphene layer 434 may extend to a midpoint of the source contact 120, whereas the second graphene layer does not extend to a midpoint of the source contact 120. One skilled in the art may contemplate extending the gate dielectric layer 432, the first graphene layer 434, and the second graphene layer 436 anywhere between 5% and 95% of a length of the source contact 120, where the first and second graphene layers 434, 436 have different lengths (and heights). In other words, the thickness of the first graphene layer 434 may be different than the thickness of the second graphene layer 436.

Figure 5:
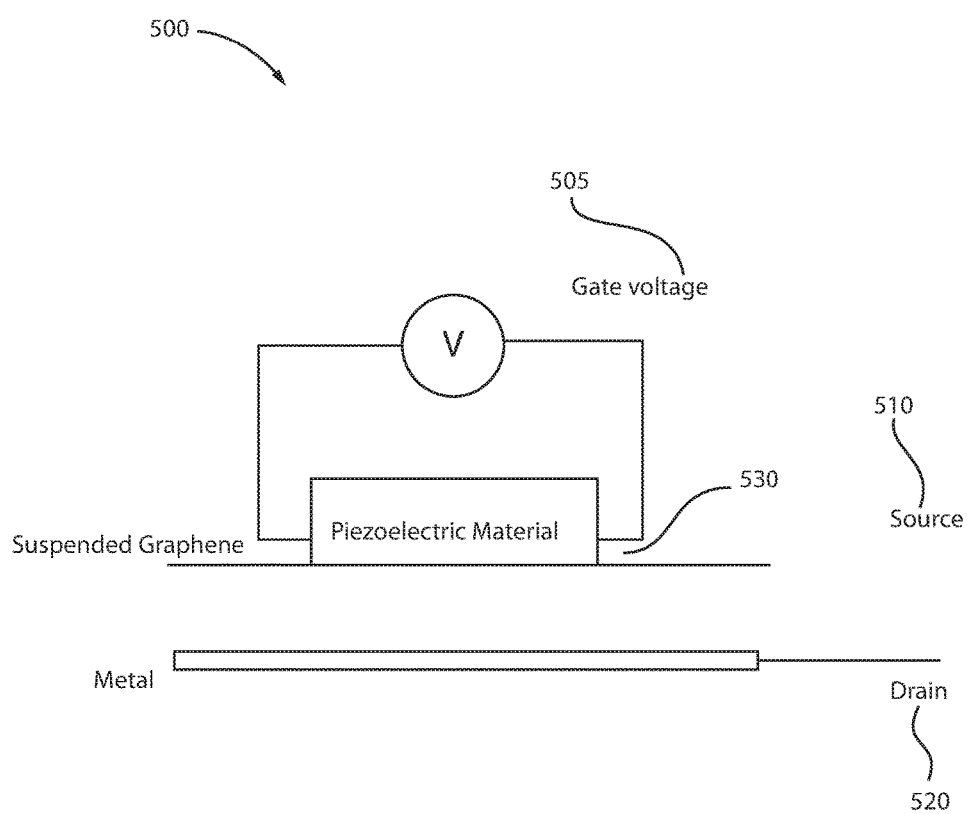
FIG. 5 is an embodiment of a semiconductor device with a gate voltage connected to a piezoelectric material having a graphene emission layer, in accordance with an embodiment of the present principles.

FIG. 5 is an embodiment of a semiconductor device with a gate voltage connected to a piezoelectric material having a graphene emission layer, in accordance with an embodiment of the present principles.

The semiconductor device 500 includes a source region 510 and a drain region 520, where a piezoelectric material having a graphene layer 530 is in contact with the source region 510. A gate voltage 505 is connected to the source region 510.

Figure 6:
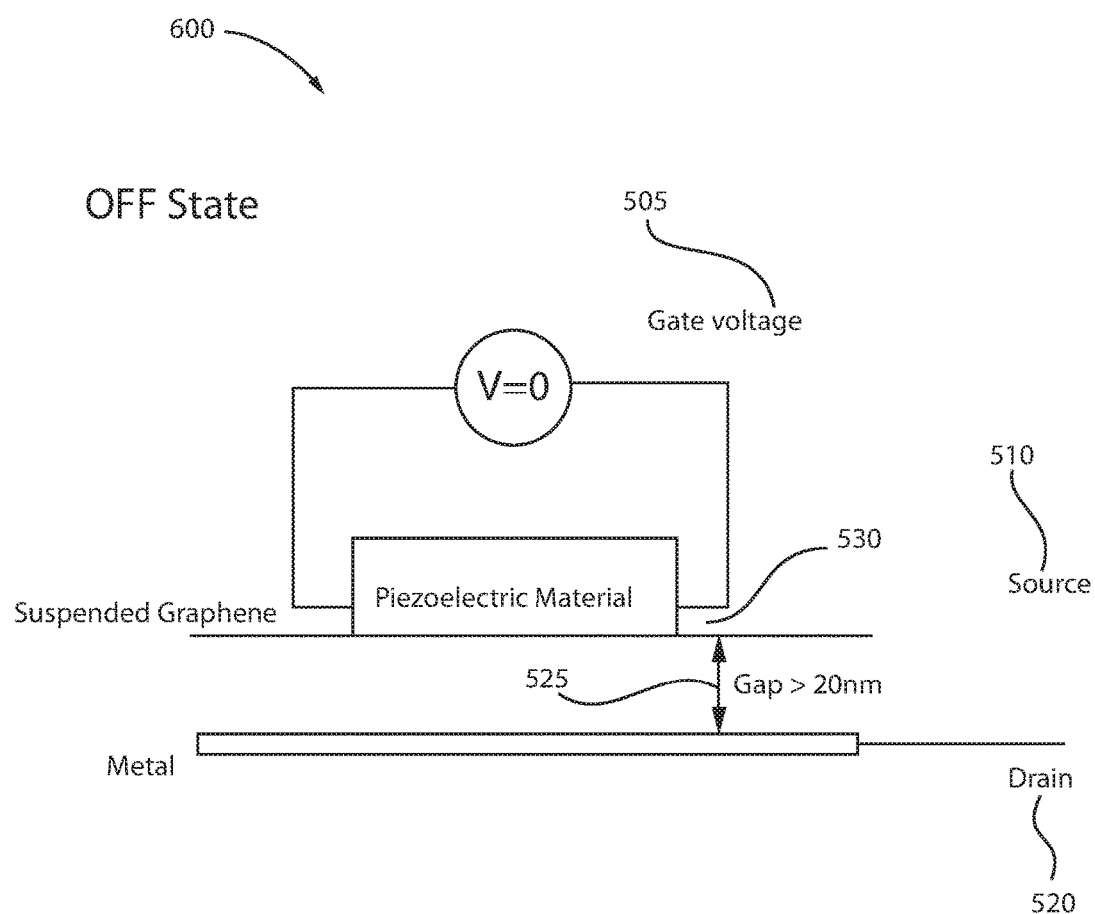
FIG. 6 is an embodiment of the semiconductor device of FIG. 5 where the device is in an OFF state, in accordance with an embodiment of the present principles.

FIG. 6 is an embodiment of the semiconductor device of FIG. 5 where the device is in an OFF state, in accordance with an embodiment of the present principles.

The semiconductor device 500 is shown in an OFF state 600, where the gate voltage 505 is set to zero. When the gate voltage 505 is set to zero, the gap 525 between the source region 510 and the drain region 520 is approximately, for example, less than 20 nm.

Figure 7:
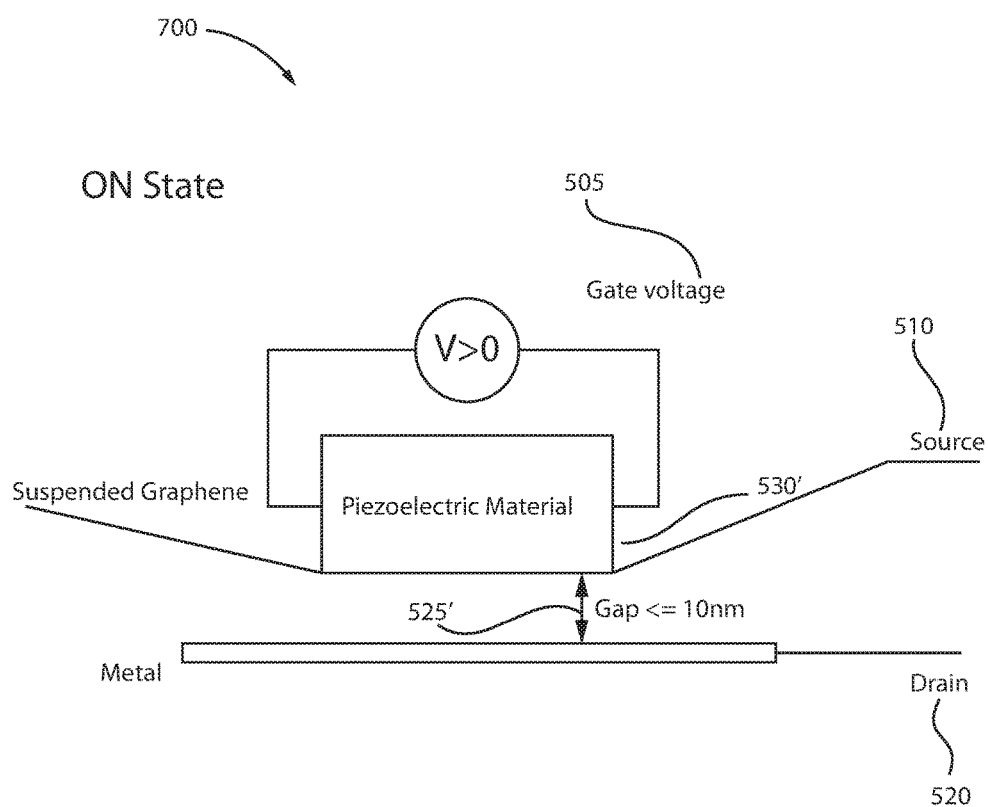
FIG. 7 is an embodiment of the semiconductor device of FIG. 5 where the device is in an ON state, in accordance with an embodiment of the present principles.

FIG. 7 is an embodiment of the semiconductor device of FIG. 5 where the device is in an ON state, in accordance with an embodiment of the present principles.

The semiconductor device 500 is shown in an ON state 700, where the gate voltage 505 is greater than zero and tunneling current (not shown) travels between the source region 510 and the drain region 520. When the gate voltage 505 is ON, the gap 525' between the source region 510 and the drain region 520 is approximately, for example, less than 10 nm because of the shifting or expansion or adjustment of the piezoelectric material 530'. Therefore, the piezoelectric material 530' aids in reducing the gap between the source region 510 and the drain region 520 of the semiconductor device 500. The gap was reduced by, for example, at least 10 nm.

In general, an operating principle of the graphene layer semiconductor switching devices of FIGS. 1-7 is that the gate contact and graphene layer modulate the thin conductive layer, which in turn modulates the semiconductor layer to achieve a steep sub-threshold slope of about 60 mV/decade or less, and allow operation at low voltage. Thus, by using free space tunneling mechanisms, a semiconductor device may switch ON and OFF with a very sharp sub-threshold slope of well below 60 mV/decade. Semiconductor devices characterized by steep sub-threshold slopes exhibit a faster transition between OFF (low current) and ON (high current) states.

Figure 8:
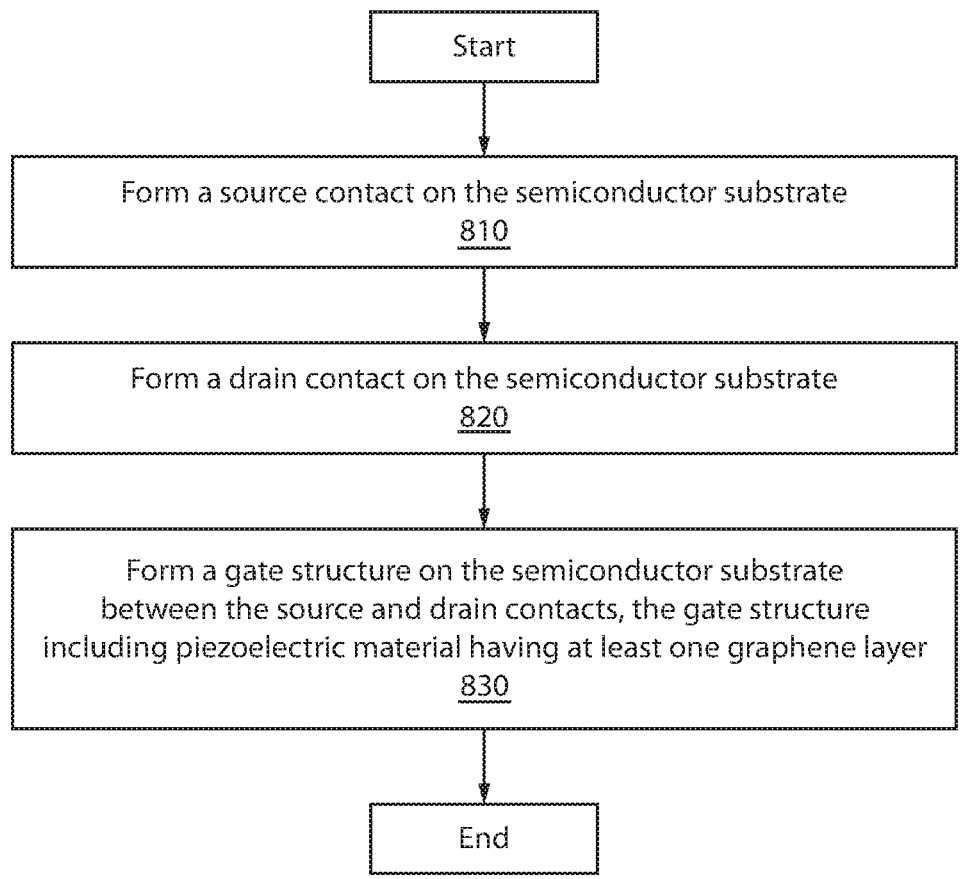
FIG. 8 is a block/flow diagram of an exemplary method for forming a semiconductor device with a graphene layer, in accordance with an embodiment of the present principles.

FIG. 8 is a block/flow diagram of an exemplary method for forming a semiconductor device with a graphene layer, in accordance with an embodiment of the present principles.

At block 810, a source contact is formed on a semiconductor substrate.

At block 820, a drain contact is formed on the semiconductor substrate.

At block 830, a gate structure is formed on the semiconductor substrate between the source and drain contacts, the gate structure including a piezoelectric material having at least one graphene layer.

One of the advantages of using a graphene layer is that graphene has extremely high electric conductivity for forming a very thin graphene material layer. One key parameter for transistors is the base resistance, and, thus, graphene may have a low base resistance even for very thin graphene material layers. A low base resistance helps achieve a high maximum frequency of oscillation, fmax. The high electrical conductivity of graphene allows for the use of a thin graphene material layer, which reduces the transit time of electrons through the base layer and also reduces the scattering energy loss of hot electrons in transiting the thin graphene material layer.

The use of graphene within a base layer of a transistor may allow for wide bandgap materials, such as AlGaN, GaN, InAlN, and SiC to be used as the collector layer material of the transistors. AlGaN, GaN, InAlN and SiC have a high Johnson figure of merit, and, thus, the graphene base transistor may allow for high power, high frequency operation of the semiconductor device.

It is to be understood that the present invention will be described in terms of a given illustrative architecture; however, other architectures, structures, substrate materials and process features and steps/blocks may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments of a method of device fabrication and a semiconductor device thereby fabricated (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a semiconductor device, comprising:
   forming a source contact over a semiconductor substrate;
   forming a drain contact over the semiconductor substrate; and
   forming a gate structure directly on the semiconductor substrate between the source and drain contacts, the gate structure including an insulating layer and a piezoelectric material having at least one graphene layer with only one surface in direct contact with the insulating layer, and the gate structure further including a gate contact disposed over the at least one graphene layer;
   wherein the at least one graphene layer and the insulating layer extend into the source contact.

2. The method of claim 1, wherein the insulating layer is formed between the semiconductor substrate and the at least one graphene layer, the insulating layer in direct contact with the semiconductor substrate.

3. The method of claim 1, wherein the gate contact, the at least one graphene layer, and the insulating layer are of approximately equal length.

4. The method of claim 1, wherein the piezoelectric material forms two graphene layers in direct contact with each other.

5. The method of claim 4, wherein the two graphene layers extend into the source contact.

6. The method of claim 4, wherein the two graphene layers are of approximately equal length.

7. The method of claim 4, wherein a first graphene layer of the two graphene layers has a first length and a second graphene layer of the two graphene layers has a second length, the first length being greater than the second length.

8. A semiconductor device, comprising:
   a semiconductor substrate;
   a source contact formed over the semiconductor substrate;
   a drain contact formed over the semiconductor substrate; and
   a gate structure formed directly on the semiconductor substrate between the source and drain contacts, the gate structure including an insulating layer and a piezoelectric material having at least one graphene layer with only one surface in direct contact with the insulating layer, and the gate structure further including a gate contact disposed over the at least one graphene layer;
   wherein the at least one graphene layer and the insulating layer extend into the source contact.

9. The device of claim 8, wherein the insulating layer is formed between the semiconductor substrate and the at least one graphene layer, the insulating layer in direct contact with the semiconductor substrate.

10. The device of claim 8, wherein the gate contact, the at least one graphene layer, and the insulating layer are of approximately equal length.

11. The device of claim 8, wherein the piezoelectric material forms two graphene layers in direct contact with each other.

12. The device of claim 11, wherein the two graphene layers extend into the source contact.

13. The device of claim 11, wherein a first graphene layer of the two graphene layers has a first length and a second graphene layer of the two graphene layers has a second length, the first length being greater than the second length.

14. A semiconductor device, comprising:
   a semiconductor substrate having a source contact, a drain contact, and a gate structure formed thereon, wherein the gate structure includes an insulating layer and a piezoelectric material having at least one graphene layer with only one surface in direct contact with the insulating layer, such that the insulating layer and the at least one graphene layer extend into the source contact.

15. The device of claim 14, wherein the insulating layer is formed between the semiconductor substrate and the at least one graphene layer, the insulating layer in direct contact with the semiconductor substrate.

16. The device of claim 15,
   wherein the gate structure further includes a gate contact disposed over the at least one graphene layer; and
   wherein the gate contact, the at least one graphene layer, and the insulating layer are of approximately equal length.

* * * * *